United States Patent [19]
Loranger et al.

[11] Patent Number: 5,791,914
[45] Date of Patent: Aug. 11, 1998

[54] ELECTRICAL SOCKET WITH FLOATING GUIDE PLATE

[75] Inventors: J. Albert Loranger; Wotaek Chung, both of Warren, Pa.

[73] Assignee: Loranger International Corporation, Warren, Pa.

[21] Appl. No.: 561,026

[22] Filed: Nov. 21, 1995

[51] Int. Cl.⁶ .................................................. H01R 23/72
[52] U.S. Cl. .................................................. 439/71; 439/66
[58] Field of Search .............................. 439/68–73, 525, 439/66

[56] References Cited

U.S. PATENT DOCUMENTS

| | | | |
|---|---|---|---|
| 3,954,175 | 5/1976 | Mason | 206/328 |
| 3,989,331 | 11/1976 | Hanlon | 439/70 |
| 4,029,375 | 6/1977 | Gabrielian | 439/66 |
| 4,130,327 | 12/1978 | Spaulding | 339/17 CF |
| 4,341,433 | 7/1982 | Cherian et al. | 339/176 MP |
| 4,345,810 | 8/1982 | Bakermans | 439/71 |
| 4,349,238 | 9/1982 | Showman et al. | 339/75 M |
| 4,376,560 | 3/1983 | Olsson et al. | 339/17 CF |
| 4,378,139 | 3/1983 | Griffin et al. | 339/75 MP |
| 4,533,192 | 8/1985 | Kelley | 339/45 M |
| 4,535,887 | 8/1985 | Egawa | 206/328 |
| 4,553,805 | 11/1985 | Aikens | 339/75 MP |
| 4,620,761 | 11/1986 | Smith | 439/372 |
| 4,621,884 | 11/1986 | Berkebile, Jr. et al. | 339/75 MP |
| 4,678,250 | 7/1987 | Romine | 439/876 |
| 4,750,890 | 6/1988 | Dube et al. | 439/152 |
| 4,758,176 | 7/1988 | Abe et al. | 439/331 |
| 4,789,345 | 12/1988 | Carter | 439/71 |
| 4,799,897 | 1/1989 | Mogi et al. | 439/264 |
| 4,931,020 | 6/1990 | Matsuoka et al. | 439/72 |
| 4,962,356 | 10/1990 | Eberlein et al. | 324/158 F |
| 4,969,828 | 11/1990 | Bright et al. | 439/68 |
| 4,986,760 | 1/1991 | Petersen et al. | 439/71 |
| 5,055,777 | 10/1991 | Bonelli et al. | 324/158 F |
| 5,109,980 | 5/1992 | Matsuoka et al. | 206/328 |
| 5,120,238 | 6/1992 | Marks et al. | 439/331 |
| 5,127,837 | 7/1992 | Shah et al. | 439/71 |
| 5,247,250 | 9/1993 | Rios | 439/70 |
| 5,518,410 | 5/1996 | Masami | 439/71 |
| 5,578,870 | 11/1996 | Farnsworth et al. | 257/727 |

FOREIGN PATENT DOCUMENTS

| | | |
|---|---|---|
| 0 398 506 | 11/1990 | European Pat. Off. . |
| 62-76273 | 4/1987 | Japan . |
| 62-76274 | 4/1987 | Japan . |
| 2-250282 | 10/1990 | Japan . |
| 2-309579 | 12/1990 | Japan . |
| WO 96/38030 | 11/1996 | WIPO . |

*Primary Examiner*—Neil Abrams
*Attorney, Agent, or Firm*—Haverstock & Associates

[57] ABSTRACT

A socket for connecting the contact pads (34) of an electrical circuit board (5) to the contact points (32) of an integrated circuit package (14). The socket has a socket body (7) including a first plurality of holes (27) and a floating guide plate (12) including a second plurality of holes (24). A plurality of contact springs (11) are supported between the socket body (7) and the floating guide plate (12). Each contact spring (11) has a first end (21) and a second end (22) with a resilient part (20) between the first end and the second end. When the integrated circuit package (14) is forced toward the floating guide plate (12), the contact springs (11) are compressed and the first ends (21) are forced against the contact points (32) of the integrated circuit package (14) and the second ends (22) are forced against the contact pads (34) on the electrical printed circuit board (5) thereby forming an electrical connection between each contact pad (34) on the electrical circuit board (5) and a corresponding contact point (32) on the integrated circuit package (14). The contact springs (11) are preferably formed as helical coil springs.

14 Claims, 2 Drawing Sheets

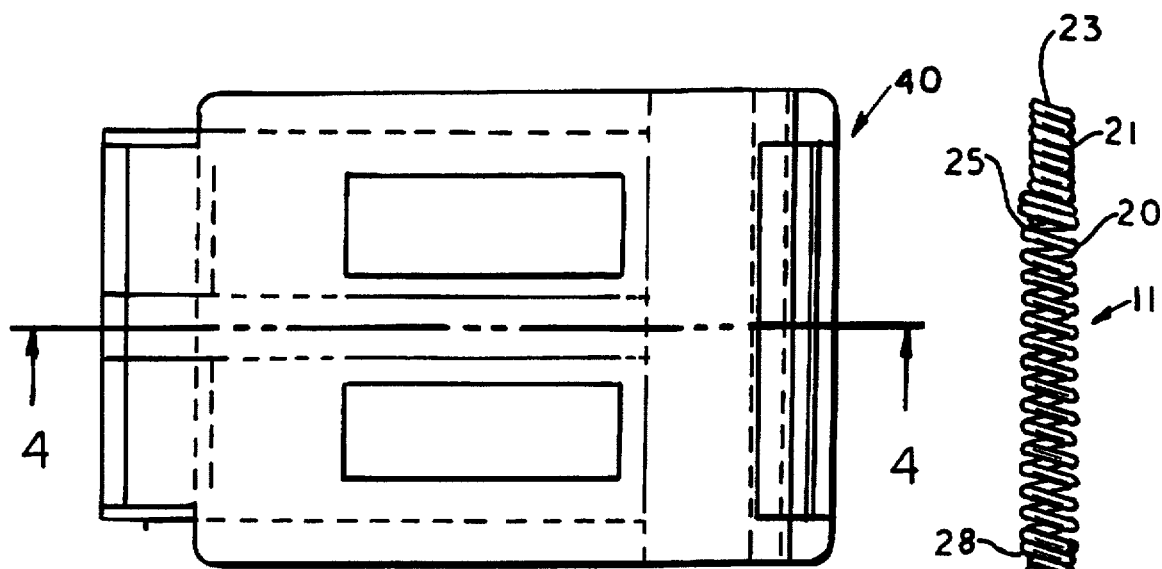
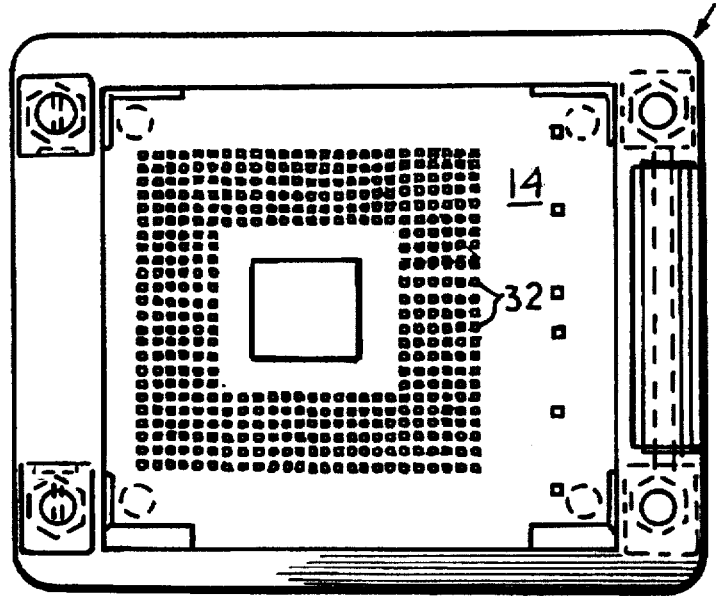
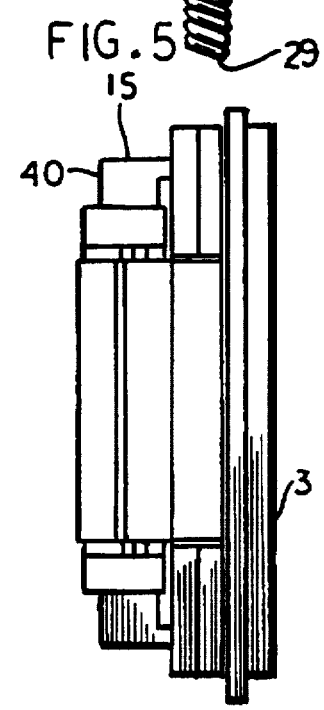
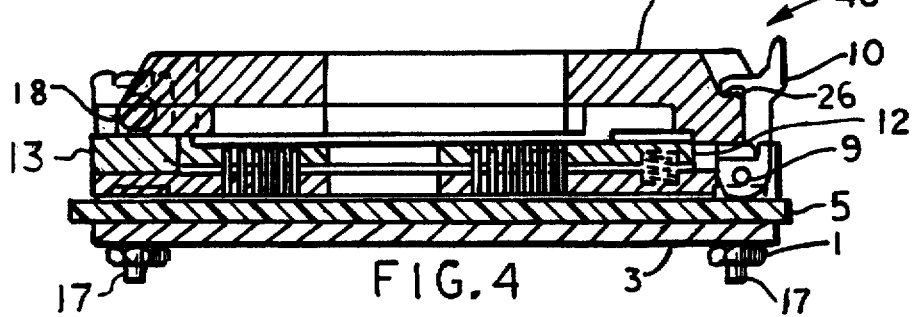

ELECTRICAL SOCKET WITH FLOATING GUIDE PLATE

BACKGROUND OF THE INVENTION

This invention relates in general to an apparatus for making electrical connections to semiconductor component packages for production grade, test grade or burn-in grade applications requiring a connector. In particular, this apparatus is a socket for connection to packages known as land grid arrays, ball grid arrays, micro ball grid arrays and known good die packages. The invention also has utility as an electrical connector in other applications.

Modern day semiconductor electronic devices are compact and often include one or more high power, high density integrated circuits, such as a multi-function system processor. As the functionality of integrated circuit components increase and as these integrated circuit board systems are becoming more dense while operating at higher speeds and dissipating more heat, the package that the integrated circuit die are put into interface to the larger printed circuit board system world must get smaller, lighter and more capable to keep up with the needs of electronic systems. These high density circuit die are being packaged into a group of new packages whose purpose is to bring the package into a smaller and smaller set of package shapes known as land grid array packages, ball grid array packages, micro ball grid array packages and known good die packages. The socket disclosed herein is designed to connect to any of the packages mentioned above and provide an improved connection, small impedance, smaller physical footprint than others on the market while improving the socket high frequency tolerance by expanding the bandwidth possible.

The socket is an assembly of several plastic parts, many springs of various shapes and ancillary pieces for assembly needs. Furthermore, the assembly can be enhanced with optional features to fan out to small footprints with internal printed circuits (metalized circuit paths), stiffening support plates, heat sinks and various hold down designs, (for example, covers). The socket invention will be explained in the preferred embodiment shown in the drawings. Applicant is aware of no relevant prior art.

SUMMARY OF THE INVENTION

It is an object of the present invention to provide an improved electrical socket.

It is another object of the present invention to provide a connector for connecting electrical circuits to component packages. The connection is simple in construction, economical to manufacture and simple and efficient to use.

With the above and other objects in view, the present invention consists of the combination and arrangement of parts hereinafter more fully described, illustrated in the accompanying drawing and more particularly pointed out in the appended claims, it being understood that changes may be made in the form, size, proportions and minor details of construction without departing from the spirit or sacrificing any of the advantages of the invention.

BRIEF DESCRIPTION OF THE DRAWING(S)

FIG. 1 is a top view of a connector cover according to the invention.

FIG. 2 is a top view of a connector without the cover of FIG. 1.

FIG. 3 is an end view of the assembled connector.

FIG. 4 is a cross sectional view taken on line 4—4 of FIG. 1.

FIG. 5 is an enlarged side view of one of the spring contacts used in the connector of FIGS. 1–3.

DESCRIPTION OF THE PREFERRED EMBODIMENT(S)

Figure 6:
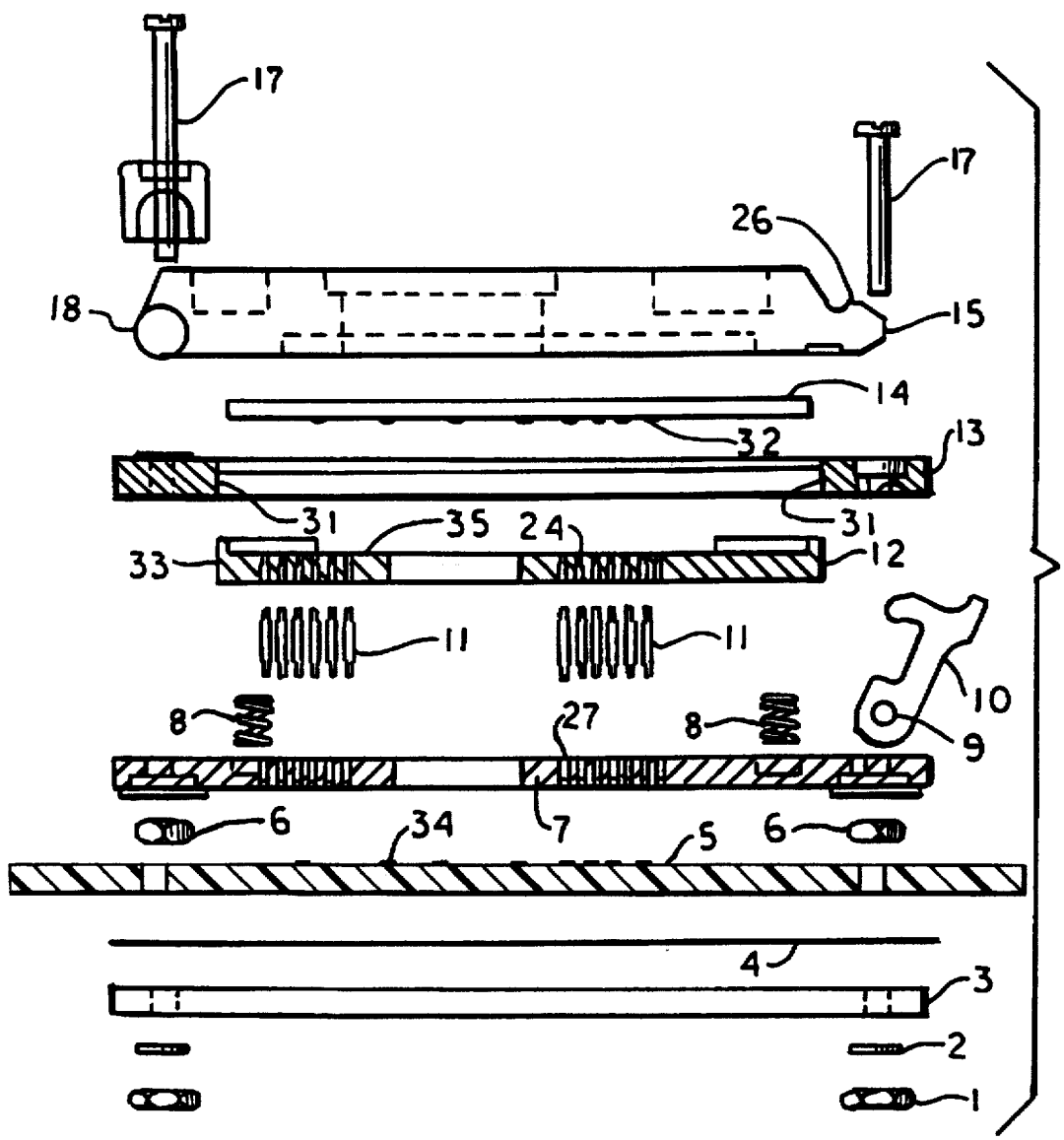
FIG. 6 is an exploded view of the connector shown in FIGS. 1 through 4.

Now with more particular reference to the drawings, the socket disclosed and shown in FIGS. 1 through 7 has the entire socket (designated by 40) made up of a cap plate 13 clamped to other parts of the socket by screws 17 and nuts 6. Cap plate 13 has window 31 which slidably receives floating guide plate 12. Floating guide plate 12 has flange 33 extending upwardly from top surface 35 for integrated circuit package 14 to rest upon.

Contact springs 11 are helical compression springs. Each contact spring 11 is made up of a continuous spring wire having loosely wound resilient intermediate section 20 disposed between and integrally connected to rigid first end section 21 and rigid second end section 22. Rigid first end section 21 and rigid second end section 22 are made up of closely wound turns making a solid fixed height. Resilient intermediate section 20 of springs 11 is of a larger diameter than rigid first end section 21 and rigid second end section 22 forming first shoulder 25 and continuing on to last shoulder 28 connecting the adjacent rigid first end section 21 and rigid second end section 22 respectfully. Floating guide plate 12 rests on first shoulder 25 and last shoulder 28 rests on socket body 7. First outer end 23 of rigid first end section 21 acts as contacts to engage contact points 32 on integrated circuit package 14 and outer end 29 of the rigid second end section 22 engages contact pads 34 on circuit board 5.

Spaced holes 27 in socket body 7 receives and holds, rigid second end section 22 of contact springs 11 relative to contact pads 34 on circuit board 5. Spaced holes 24 in guide plate 12 locates and holds outer ends 21 relative to contact points 32 on package 14. Thus, when socket body 7 and cap plate 13 are clamped together by screws 17, as shown in FIG. 7, resilient intermediate section 20 of springs 11 forces outer end 29 into contact with contact pads 34 on circuit board 5 and inner ends 23 are held in contact with contact points 32 on integrated circuit package 14.

Figure 7:
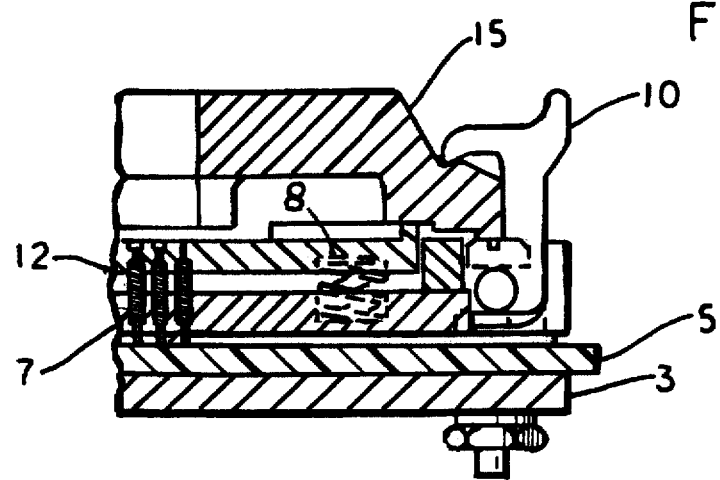
FIG. 7 is an enlarged partial view of FIG. 4.

Socket body 7 and floating guide plate 12 are further urged away from each other by support springs 8 which engage socket body 7 and guide plate 12 as shown in FIG. 7.

Window 31 in cap plate 13 slidably receives plate 12 and aligns floating guide plate 12 with integrated circuit package 14. Cover 15 holds integrated circuit package 14 down in the floating guide plate 12 while it is aligned in window 31. Cover 15 is pivoted to cap plate 13 by hinge 18. Cover 15 swings down to the position shown in FIG. 4, and is held in position by latch 10 which is attached by pivot pin 9.

Latch 10 overlies detent 26 when closed. As an alternate, cover 15 could be made as an open frame with the same function of holding integrated circuit package 14 in contact with springs 11.

Insulator film 4 is supported between support plate 3 and circuit board 5 which are held together by screw 17, nuts 1 and washers 2. Support plate 3 and cap plate 13 are held in spaced relation to one another by screw 17 and nut 1 with springs 11 supported on circuit board 5 and engaging floating guide plate 12 toward package 14. Spring 8 is supported between body 7 and floating guide plate 12 urging them away from one another. Support plate 3 functions as a stiffener to combat the non-conformance of the assembly and optionally, as a heat sink when the insulator film 4 is thermally conductive. Furthermore, support plate 3 can also function as an electrical ground or voltage plane when circuit board 5 has electrical vias to connect certain spring contacts 11 through a electrically conductive film 4. Pivot pin 9 allows latch 10 to rotate onto cover 15 to give a "clam shell" action to cover 15.

Latch 10 rotates over detent 26 on cover 15 to hold cover 15 in a closed position. Hinge 18 secures cover 15 as it swings down to engaging cap plate 13 to bring contact points 32 on integrated circuit package 14 against outer end 23 of rigid first end section of contact spring 11 to bring outer end 29 of rigid second end section 22 of contact spring 11 against contact pads 34 and to lock cover 15 when detent 26 is under latch 10. Screws 17 extend through the assembly to tighten down the adjacent pieces when nuts 1 and 6 are tightened.

As an alternate, support plate 3 could be made in the form of a heat sink using heat sink technology, or support plate 3 could be made of electrically conductive material so at support plate 3 will provide an electrical ground connection as well as providing support for the electrical socket and serving as a heat sink. The film 4 alternatively is made of electrically and/or thermally conductive material.

Normally, integrated circuit package 14 would be loaded "live bug" into socket 40 for packages with the spacing of contact points 32 of one millimeter or greater. However, when finer pitch centers are required, a metalized combination of a printed circuit and a conductive elastomeric contact bed material will be introduced into floating guide plate 12 to fan out the contact points (balls or pads) of a "dead bug" integrated circuit packages in the micro ball grid array or known good die form located in a pocket in the center of floating plate 12.

These printed circuits that replace the integrated circuit package 14 are metalized paths to bear against a smaller integrated circuit, dead bug inverted package loaded into a recess in floating guide plate 12 through an elastomeric interposer when input/output points (the balls or pads) are oriented upwards towards the printed circuits in the socket. These same metalized paths will function to) reconfigure these input/output points to a new array beyond the mechanical constraints to allow the spring contacts 11 to connect to them and thus bridge the circuits on small packages. These metalized paths can be constructed of inserted conventional printed circuit boards, thick film depositions, or thin film deposited circuits along with other interposer materials that would be pressed against spring 11 by the cover 15.

Additional circuit design is further provided by metalizing other sections of the plastic pieces such as the body 7, to reduce impedance, add internal ground planes and include resistive, capacitive or inductive elements when required.

The support plate 3 shown is but one way to add the heat sink function to the design when thermal vias or heat slugs are incorporated in the package 14. Other configurations might be to affix a spring loaded heat sink in the cover 15 which will compress against the package 14 when the cover is rotated to a closed position.

The option ways to provide the pressure against the springs 11 by the cover 15 will take the form of replacing the present cover latch hinge mechanism with a metal spider shaped spring to latch against the body 7 for a lower profile socket requirement or to replace the pictured mechanism with a top actuated, open-top, camming version for automation loading.

The foregoing specification sets forth the invention in its preferred, practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. A connector for connecting contact points on an integrated circuit package to contact pads on a printed circuit board comprising:

a. a floating guide plate including a first plurality of holes;

b. a socket body including a second plurality of holes; and c. a plurality of compression-type contact springs each having a body, a first spring end and a second spring end, the plurality of compression-type contact springs positioned between the socket body and the floating guide plate such that the first spring ends of the plurality of compression-type contact springs extend through the first plurality of holes to engage the contact points on the integrated circuit package and the second spring ends of the plurality of compression-type contact springs extend through the second plurality of holes to engage the contact pads on the printed circuit board, wherein the bodies of the compression-type contact springs are of a diameter which is larger than a size of the first and second plurality of holes such that the body of each compression-type contact spring has a first shoulder on which the floating guide plate rests and a second shoulder which rests on the socket body.

2. The connector as claimed in claim 1 wherein at least one of the first and second spring ends of each of the plurality of compression-type contact springs is of a helical shape.

3. The connector as claimed in claim 1 further comprising one or more pressure springs positioned between the socket body and the floating guide plate for urging the floating guide plate in a direction away from the socket body.

4. A connector for connecting contact points on an integrated circuit package to contact pads on a printed circuit board comprising:

a. a floating guide plate including a first plurality of holes;

b. a socket body including a second plurality of holes; and c. a plurality of compression-type contact springs each having a body, a first spring end and a second spring end, the plurality of compression-type contact springs positioned between the socket body and the floating guide plate such that the first spring ends of the plurality of compression-type contact springs extend through the first plurality of holes to engage the contact points on the integrated circuit package and the second spring ends of the plurality of compression-type contact springs extend through the second plurality of holes to engage the contact pads on the printed circuit board, wherein the bodies of the compression-type contact springs are of a diameter which is larger than a size of the first and second plurality of holes such that the body of each compression-type contact spring has a first shoulder on which the floating guide plate rests and a second shoulder which rests on the socket body; and d. one or more pressure springs positioned between the socket body and the floating guide plate for urging the floating guide plate in a direction away from the socket body and towards the integrated circuit package.

5. The connector as claimed in claim 4 wherein at least one of the first and second spring ends of each of the plurality of compression-type contact springs is of a helical shape.

6. The connector as claimed in claim 5 wherein the bodies of the compression-type contact springs are of a helical shape.

7. The connector as claimed in claim 6 wherein the bodies of the compression-type contact springs are resilient and urge the floating guide plate in a direction away from the socket body.

8. The connector as claimed in claim 4 wherein both of the first and second spring ends of each of the plurality of compression-type contact springs are of a helical shape.

9. A connector for connecting contact points on an integrated circuit package to contact pads on a printed circuit board comprising:

a. a floating guide plate including a first plurality of holes;

b. a socket body including a second plurality of holes; and c. a plurality of compression-type contact springs each having a body, a first spring end and a second spring end, the plurality of compression-type contact springs positioned between the socket body and the floating guide plate such that the first spring ends of the plurality of compression-type contact springs extend through the first plurality of holes to engage the contact points on the integrated circuit package and the second spring ends of the plurality of compression-type contact springs extend through the second plurality of holes to engage the contact pads on the printed circuit board, wherein the bodies of the compression-type contact springs are of a diameter which is larger than a size of the first and second plurality of holes such that the body of each compression-type contact spring has a first shoulder on which the floating guide plate rests and a second shoulder which rests on the socket body, and at least one of the first and second spring ends of each of the plurality of compression-type contact springs is of a helical shape within an associated one of the first and second plurality of holes;

d. a cap plate coupled to the socket body and having a window wherein the floating guide plate is positioned for maintaining the floating guide plate in a proper orientation relative to the socket body and the printed circuit board; and e. a cover pivotably coupled to the cap plate for securing the integrated circuit package above the floating guide plate.

10. The connector as claimed in claim 9 further comprising one or more pressure springs positioned between the socket body and the floating guide plate for urging the floating guide plate in a direction away from the socket body.

11. A connector for connecting contact points on an electronic component package to contact pads on a printed circuit board comprising:

a. a socket body including a plurality of holes;

b. a plurality of compression-type contact elements each having a body, a first spring end and a second spring end, the plurality of compression-type contact elements positioned within the socket body such that the second spring ends of the plurality of compression-type contact elements extend through the plurality of holes to engage the contact pads on the printed circuit board and the first spring ends of the plurality of compression-type contact elements extend above the socket body to engage the contact points on the electronic component package, wherein the bodies of the contact elements are of a diameter which is larger than a size of the plurality of holes for retaining the contact elements within the plurality of holes and further wherein both of the first and second spring ends of the plurality of contact elements are of a helical shape as the spring ends extend above the socket body and as the spring ends extend within associated ones of the plurality of holes; and c. a floating guide plate positioned above the socket body, wherein the contact elements engage the contact points on the electronic component package through the floating guide plate.

12. The connector as claimed in claim 11 further comprising one or more pressure springs positioned between the socket body and the floating guide plate for urging the floating guide plate in a direction away from the socket body.

13. The connector as claimed in claim 12 wherein the contact elements are springs and the bodies of the compression-type contact springs are of a helical shape.

14. The connector as claimed in claim 13 wherein the electronic component package is an integrated circuit package.

* * * * *